(12) United States Patent
Liang et al.

(10) Patent No.: US 10,707,835 B1
(45) Date of Patent: Jul. 7, 2020

(54) WIRELESS RECEIVING DEVICE

(71) Applicant: Industrial Technology Research Institute, Hsinchu (TW)

(72) Inventors: Chia-Jen Liang, Kaohsiung (TW); Yen-Cheng Kuan, Kaohsiung (TW); Ching-Wen Chiang, Chiayi (TW); Mau-Chung Chang, Taipei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 16/232,710

(22) Filed: Dec. 26, 2018

(30) Foreign Application Priority Data

Dec. 18, 2018 (TW) .............................. 107145583 A

(51) Int. Cl.
| | | |
|---|---|---|
| *H04B 1/06* | (2006.01) | |
| *H03H 11/28* | (2006.01) | |
| *H03F 3/19* | (2006.01) | |
| *H03F 3/45* | (2006.01) | |
| *H03D 7/12* | (2006.01) | |
| *H04B 1/16* | (2006.01) | |

(52) U.S. Cl.
CPC ............ *H03H 11/28* (2013.01); *H03D 7/125* (2013.01); *H03F 3/19* (2013.01); *H03F 3/45179* (2013.01); *H04B 1/16* (2013.01); *H03F 2200/294* (2013.01); *H03F 2200/451* (2013.01); *H03F 2203/45544* (2013.01); *H03F 2203/45554* (2013.01)

(58) Field of Classification Search
CPC .. H04B 1/16; H04B 1/40; H04B 1/04; H04W 88/02; H04W 88/06; H03F 2200/72; H03F 2200/294; H03F 2200/451; H03F 2203/7209

USPC .................... 455/234.1, 248.1, 295, 296
See application file for complete search history.

(56) References Cited

U.S. PATENT DOCUMENTS

| | | | | |
|---|---|---|---|---|
| 7,299,020 | B2 | 11/2007 | Shen et al. | |
| 7,774,019 | B2 | 8/2010 | Sivonen et al. | |
| 8,233,871 | B2 * | 7/2012 | Keehr ................ | H04B 1/109 455/285 |
| 8,242,844 | B2 * | 8/2012 | Rafi ..................... | H03F 3/19 330/277 |
| 8,570,106 | B2 * | 10/2013 | Kim ..................... | H03F 1/223 330/260 |

(Continued)

FOREIGN PATENT DOCUMENTS

| | | |
|---|---|---|
| TW | I252632 B | 4/2006 |
| TW | 201249115 A1 | 12/2012 |

(Continued)

OTHER PUBLICATIONS

Taiwan Patent Office, Office Action, Patent Application Serial No. 107145583, dated Mar. 18, 2019, Taiwan.
J. Mitola, "The software radio architecture," IEEE Commun. Mag., May 1995, pp. 26-38, vol. 33, No. 5, IEEE, US.
C. Andrews et al., "A Passive Mixer-First Receiver With Digitally Controlled and Widely Tunable RF Interface," IEEE Journal of Solid-State Circuits, Dec. 2010, pp. 2696-2708, vol. 45, No. 12, IEEE, US.

(Continued)

*Primary Examiner* — Quochien B Vuong

(57) ABSTRACT

A wireless receiving device is provided. The wireless receiving device includes a first passive mixer and a common gate amplifier. The first passive mixer receives an oscillation signal. The common gate amplifier is coupled to the first passive mixer, and automatically adjusts the input impedance of the common gate amplifier according to the oscillation frequency of the oscillation signal.

6 Claims, 8 Drawing Sheets

(56) References Cited

U.S. PATENT DOCUMENTS

| | | | |
|---|---|---|---|
| 8,577,325 | B2 | 11/2013 | Lee et al. |
| 8,664,729 | B2 * | 3/2014 | Jou .................. H01L 29/42372 |
| | | | 257/368 |
| 8,965,322 | B2 * | 2/2015 | Mu ........................ H03F 1/223 |
| | | | 330/291 |
| 9,037,095 | B2 | 5/2015 | Ylamurto |
| 9,154,243 | B2 | 10/2015 | Fernando et al. |
| 9,160,388 | B2 * | 10/2015 | Mikhemar ............... H04B 1/16 |
| 9,178,549 | B2 * | 11/2015 | Harwalkar ............... H04B 1/18 |
| 9,312,818 | B2 * | 4/2016 | Mattisson ............... H03F 3/185 |
| 9,407,482 | B2 | 8/2016 | Aggarwal et al. |
| 9,431,963 | B2 | 8/2016 | Wang et al. |
| 9,806,677 | B2 * | 10/2017 | Mastantuono .......... H03F 1/483 |
| 10,014,830 | B2 * | 7/2018 | Chen .................. H03F 3/45659 |
| 10,320,338 | B2 * | 6/2019 | Sjoland .................... H03F 3/213 |
| 2007/0096980 | A1 | 5/2007 | Gradincic et al. |
| 2017/0359040 | A1 | 12/2017 | Naeini et al. |

FOREIGN PATENT DOCUMENTS

| | | |
|---|---|---|
| TW | I551065 B | 9/2016 |
| TW | I556571 B | 11/2016 |
| TW | 201838322 A | 10/2018 |

OTHER PUBLICATIONS

H. Wu et al., "A Blocker-Tolerant Inductor-Less Wideband Receiver With Phase and Thermal Noise Cancellation," IEEE Journal of Solid-State Circuits, Dec. 2015, pp. 2948-2964, vol. 50, No. 12, IEEE, US.

NR frequency band, Dec. 2018, 4 pages.

Wireless Gigabit Alliance, Dec. 2018, 5 pages, Wikipedia.

A. Bazrafshan et al., "A 0.8-4-GHz Software-Defined Radio Receiver With Improved Harmonic Rejection Through Non-Overlapped Clocking," IEEE Transactions on Circuits and Systems I: Regular Papers. Oct. 2018, pp. 3186-3195, vol. 65, No. 10,IEEE, US.

R. Chen et al., "A 0.5-to-3 GHz Software-Defined Radio Receiver Using Discrete-Time RF Signal Processing," IEEE Journal of Solid-State Circuits, May 2014, pp. 1097-1111. vol. 49, No. 5, IEEE, US.

A. Abidi, "Evolution of a Software-Defined Radio Receiver's RF Front-End," IEEE Radio Frequency Integrated Circuits (RFIC) Symposium, 2006, pp. 4 pages, IEEE, US.

David Murphy et al., "A Blocker-Tolerant Wideband Noise Cancelling Receiver with a 2dB Noise Figure," 2012 IEEE ISSCC, Feb. 2012, pp. 74-76, IEEE, US.

\* cited by examiner

US 10,707,835 B1

WIRELESS RECEIVING DEVICE

CROSS REFERENCE TO RELATED APPLICATIONS

This Application claims priority of Taiwan Patent Application No. 107145583 filed on Dec. 18, 2018, the entirety of which is incorporated by reference herein.

BACKGROUND

Field of the Disclosure

The disclosure generally relates to a wireless receiving device technology, and more particularly, to a wireless receiving device technology for automatically adjusting the input impedance according to the oscillation frequency of the oscillation signal by a common gate amplifier.

Description of the Related Art

In the wireless receiving device technology, if a wireless receiving needs to be operated in different frequency bands, extra elements need to be configured in the receiving device. For example, a plurality of low-noise amplifiers are configured in the receiving device, or other receiver paths are configured in the receiving device. Therefore, the manufacturing process of the receiving device will need a larger area. In addition, when the above wireless receiving devices that can be operated in different frequency bands are applied in the millimeter-wave frequency bands (e.g. the bands specified in 5th Generation Communication System (5G) or Wireless Gigabit Alliance (WiGig)), higher noise figures may occur.

SUMMARY

A wireless receiving device, which automatically adjusts the input impedance according to the oscillation frequency by a common gate amplifier, is provided to overcome the problems described above.

An embodiment of the disclosure provides a wireless receiving device. The wireless receiving device comprises a first passive mixer and a common gate amplifier. The first passive mixer receives an oscillation signal. The common gate amplifier is coupled to the first passive mixer, and automatically adjusts the input impedance of the common gate amplifier according to the oscillation frequency of the oscillation signal.

In some embodiments, the common gate amplifier has a single-end input and a single-end output. In some embodiments, the common gate amplifier has a differential input and a differential output. In some embodiments, the common gate amplifier has a single-end input and a differential output.

Other aspects and features of the disclosure will become apparent to those with ordinary skill in the art upon review of the following descriptions of specific embodiments of the wireless receiving devices.

BRIEF DESCRIPTION OF THE DRAWINGS

The disclosure will become more fully understood by referring to the following detailed description with reference to the accompanying drawings, wherein.

DETAILED DESCRIPTION OF THE DISCLOSURE

The following description is of the best-contemplated mode of carrying out the disclosure. This description is made for the purpose of illustrating the general principles of the disclosure and should not be taken in a limiting sense. The scope of the disclosure is best determined by reference to the appended claims.

Figure 1:
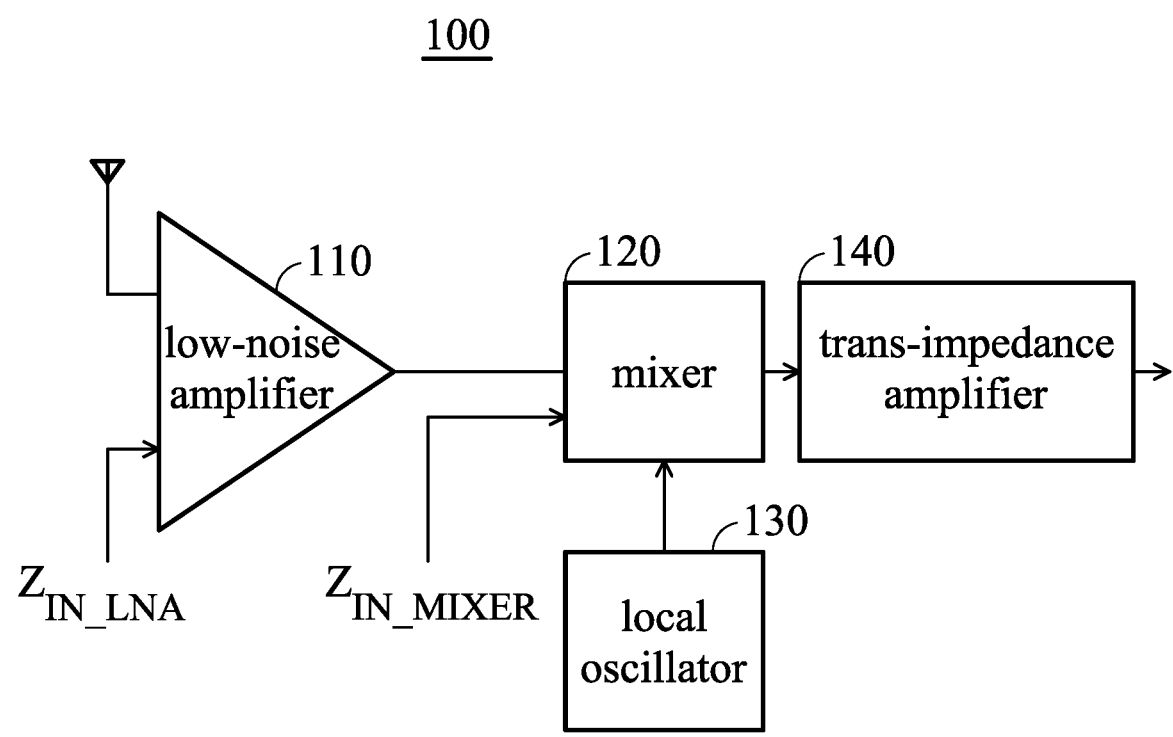
FIG. 1 is a schematic diagram of a wireless receiving device 100 according to an embodiment of the disclosure.

FIG. 1 is a schematic diagram of a wireless receiving device 100 according to an embodiment of the disclosure. According to the embodiments of the disclosure, the wireless receiving device may be applied and operated in different millimeter-wave frequency bands (e.g. the bands specified in 5th Generation Communication System (5G) or Wireless Gigabit Alliance (WiGig)). As shown in FIG. 1, the wireless receiving device 100 may comprise a low-noise amplifier (LNA) 110, a mixer 120, a local oscillator 130 and a trans-impedance amplifier (TIA) 140. It should be noted that in order to clarify the concept of the disclosure, FIG. 1 presents a simplified block diagram in which the elements relevant to the disclosure are shown, but the disclosure should not be limited to what is shown in FIG. 1. In the embodiments of the disclosure, the wireless receiving device 100 may also comprise other elements, such as analog base band (ABB), analog-to-digital convertor (ADC), and so on.

According to an embodiment of the disclosure, the transistors of the wireless receiving device 100 may be manufactured through advanced manufacturing processes for the Complementary Metal-Oxide-Semiconductor (CMOS). In the embodiments of the disclosure, the advanced manufacturing processes may be the manufacturing processes for the CMOS whose gate length is smaller than 55 nm, e.g. the 40 nm manufacturing process, 28 nm manufacturing process or 22 nm manufacturing process for the CMOS, but the disclosure should not be limited thereto.

According to the embodiments of the disclosure, the low-noise amplifier 110 is a common gate amplifier. Furthermore, in the embodiments of the disclosure, the mixer 120 is a passive mixer. The mixer 120 may be coupled to the local oscillator 130 to receive the oscillation signals. The input impedance $Z_{IN\_MIXER}$ of the mixer 120 may be changed according to the different oscillation frequencies $f_{LO}$ of the oscillation signals.

In addition, in the embodiments of the disclosure, the low-noise amplifier 110 may dynamically adjust its input impedance $Z_{IN\_LNA}$ according to the input impedance $Z_{IN\_MIXER}$ of the mixer 120 to make the wireless receiving device 100 can operate in different millimeter-wave frequency bands. In other words, the input impedance $Z_{IN\_LNA}$ of the low-noise amplifier 110 can be changed along with the changes of the oscillation frequency of the oscillation signal. Details of the change of the input impedance $Z_{IN\_LNA}$ of the low-noise amplifier 110 will be discussed in the following embodiments.

Figure 2:
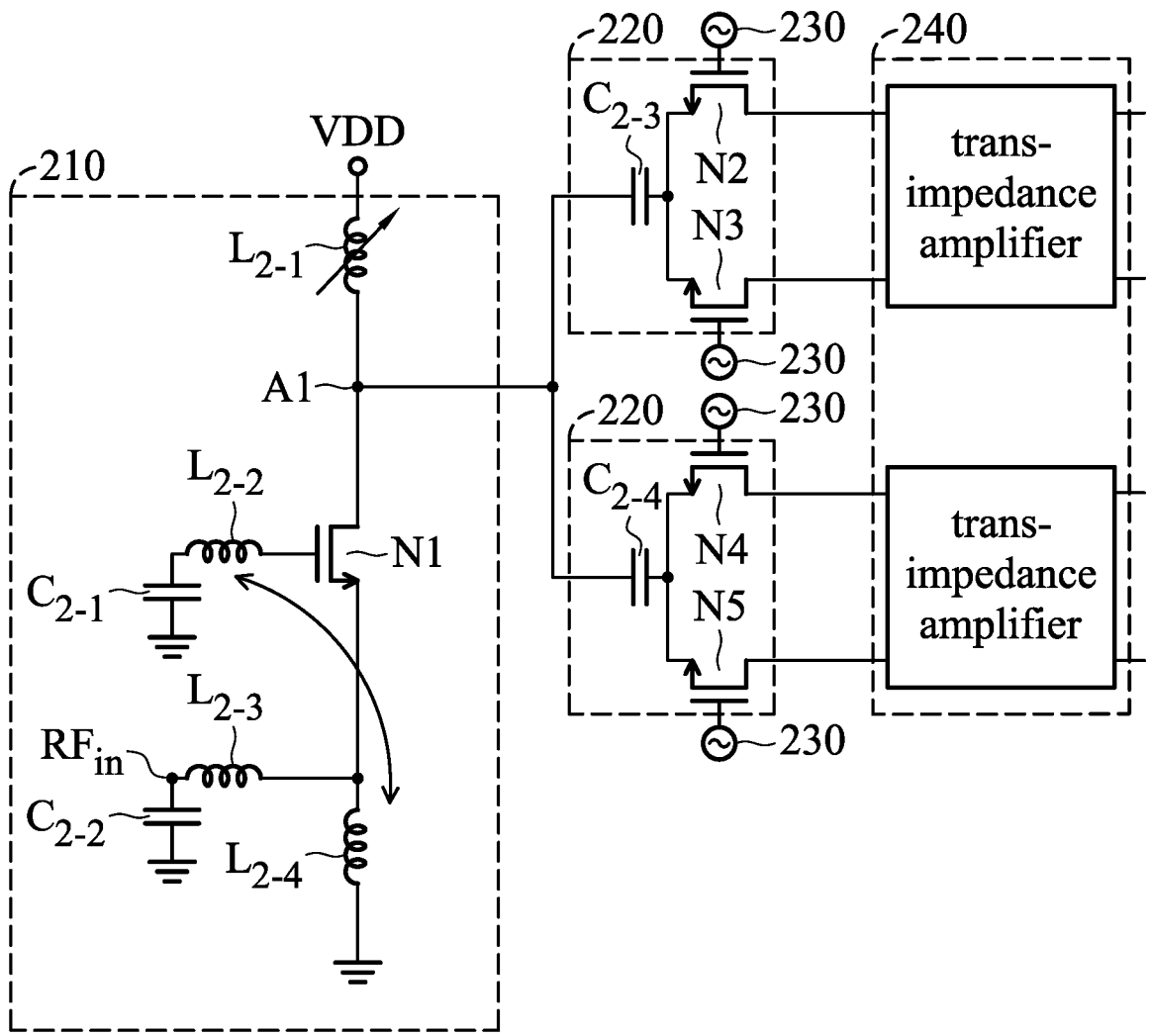
FIG. 2 is a circuit diagram of a wireless receiving device 200 according to an embodiment of the disclosure.

FIG. 2 is a circuit diagram of a wireless receiving device 200 according to an embodiment of the disclosure. As shown in FIG. 2, the low-noise amplifier 210 (i.e. a common gate amplifier) may comprise a first inductor $L_{2-1}$, a second inductor $L_{2-2}$, a third inductor $L_{2-3}$, a fourth inductor $L_{2-4}$, a first transistor N1, a first capacitor $C_{2-1}$, and a second capacitor $C_{2-2}$, wherein the first inductor $L_{2-1}$ is an adjustable inductor, and it is coupled to a power source VDD. The gate of the first transistor N1 is coupled to the second inductor $L_{2-2}$, the drain of the first transistor N1 is coupled to the first inductor $L_{2-1}$, and the source of the first transistor N1 is coupled to the third inductor $L_{2-3}$ and the fourth inductor $L_{2-4}$, wherein the second inductor $L_{2-2}$ and the fourth inductor $L_{2-4}$ may form a transformer structure. In the embodiment, the low-noise amplifier 210 has a single-end input and a single-end output. The low-noise amplifier 210 may receive input signal from the node $RF_{in}$, and output the processed signal from the node A1.

In addition, as shown in FIG. 2, the mixer 220 is a passive I/Q mixer, and the mixer 220 may comprise a group of mixers, wherein the mixers of the group have a phase difference of 90-degrees to each other. The mixer 220 may comprise a third capacitor $C_{2-3}$, a fourth capacitor $C_{2-4}$, a second transistor N2, a third transistor N3, a fourth transistor N4, and a fifth transistor N5. The source of the second transistor N2 and the source of the third transistor N3 are coupled to the low-noise amplifier 210 at the node A1 through the third capacitor $C_{2-3}$ and the source of the fourth transistor N4 and the source of the fifth transistor N5 are coupled to the low-noise amplifier 210 at the node A1 through the fourth capacitor $C_{2-4}$. The gates of the second transistor N2, the third transistor N3, the fourth transistor N4, and the fifth transistor N5 are coupled to the local oscillator 230 to receive the oscillation signals. The drains of the second transistor N2, the third transistor N3, the fourth transistor N4, and the fifth transistor N5 are coupled to the trans-impedance amplifier 240 to transmit the mixed signals to the trans-impedance amplifier 240. Then, the trans-impedance amplifier 240 may transmit the signals that it processed itself to the back-end circuits.

According to an embodiment of the disclosure, the low-noise amplifier 210 may obtain the input impedance $Z_{IN\_MIXER}$ of the mixer 220 from the node A1, and dynamically adjust its input impedance $Z_{IN\_LNA}$ according to the input impedance $Z_{IN\_MIXER}$. Specifically, the input impedance $Z_{IN\_LNA}$ of the low-noise amplifier 210 and the input impedance $Z_{IN\_MIXER}$ of the mixer 220 can be indicated as the following formulas:

$$Z_{IN\_LNA}(\omega) \approx \frac{ro + Z_{IN\_MIXER}(\omega)}{1 + gm * ro}$$

$$Z_{IN_{MIXER}}(\omega) \approx R_{SW} + \frac{2}{\pi^2}[Z_{BB}(\omega - \omega_{LO}) + Z_{BB}(\omega + \omega_{LO})],$$

wherein ro is the intrinsic output impedance of the low-noise amplifier 210, gm is the transconductance of the first transistor N1, $\omega_{LO}$ is the oscillation frequency of the oscillation signal, $R_{sw}$ is the equivalent resistor of the mixer 220, and $Z_{BB}$ is the input impedance of the trans-impedance amplifier 240. In the advanced manufacturing processes, the value of ro is very small. Therefore, referring to the above formulas, when the value of ro becomes smaller, the input impedance $Z_{IN\_LNA}$ of the low-noise amplifier 210 approaches the input impedance $Z_{IN\_MIXER}$ of the mixer 220. In other words, the input impedance $Z_{IN\_LNA}$ of the low-noise amplifier 210 can be changed along with the changes of the oscillation frequency $\omega_{LO}$ (or $f_{LO}$).

According to an embodiment of the disclosure, the resonant frequency of the value of first inductor $L_{2-1}$ may be adjusted to the oscillation frequency.

Figure 3:
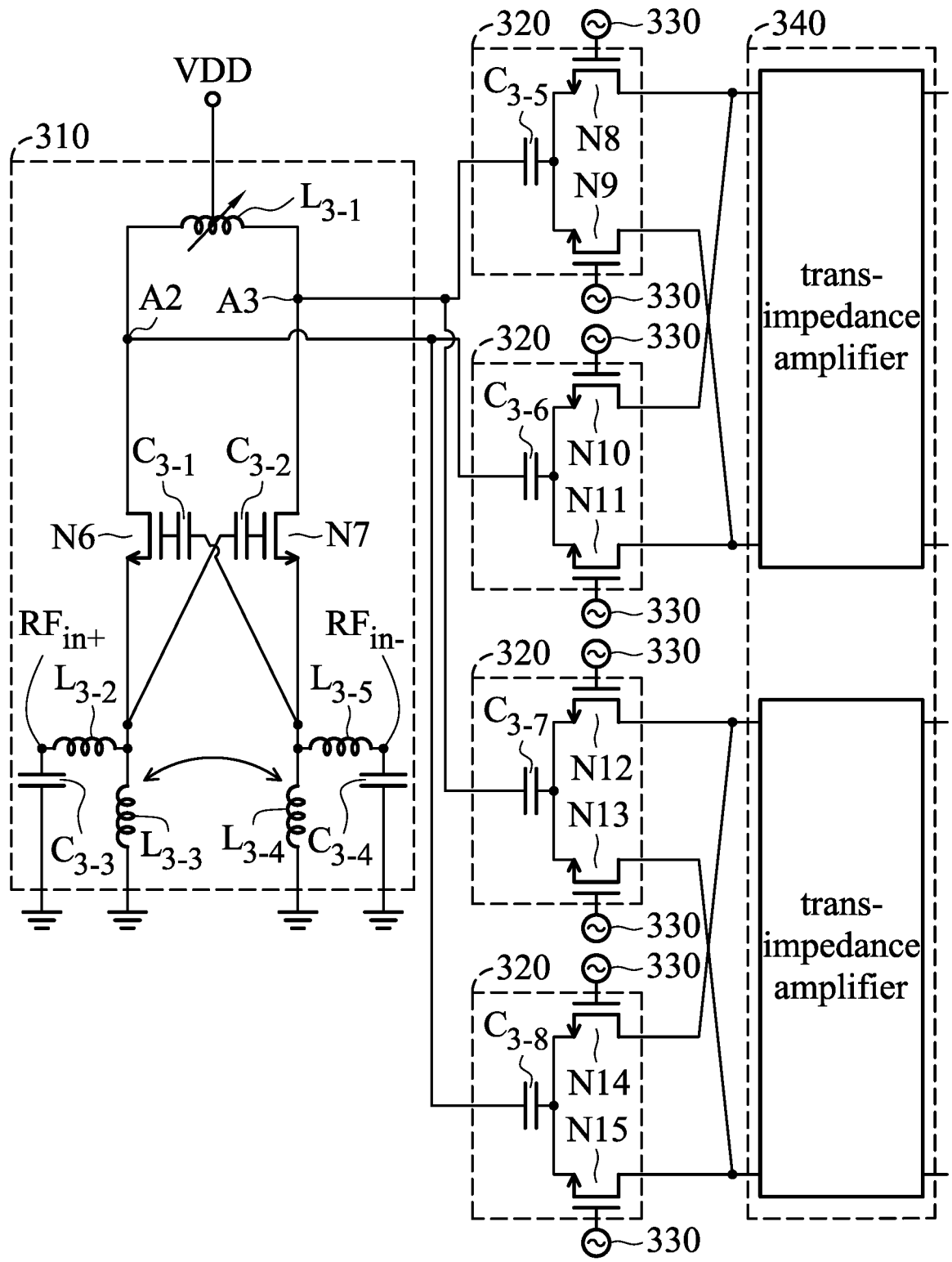
FIG. 3 is a circuit diagram of a wireless receiving device 300 according to another embodiment of the disclosure.

FIG. 3 is a circuit diagram of a wireless receiving device 300 according to another embodiment of the disclosure. As shown in FIG. 3, the low-noise amplifier 310 (i.e. a common gate amplifier) may comprise a fifth inductor $L_{3-1}$, a sixth inductor $L_{3-2}$, a seventh inductor $L_{3-3}$, an eighth inductor $L_{3-4}$, a ninth inductor $L_{3-5}$, a sixth transistor N6, a seventh transistor N7, a fifth capacitor $C_{3-1}$, a sixth capacitor $C_{3-2}$, a seventh capacitor $C_{3-3}$, and an eighth capacitor $C_{3-4}$, wherein the fifth inductor $L_{3-1}$ is an adjustable inductor, and it is coupled to a power source VDD and the seventh inductor $L_{3-3}$ and the eighth inductor $L_{3-4}$ may form a transformer structure. The gate of the sixth transistor N6 is coupled to the source of the seventh transistor N7 through the fifth capacitor $C_{3-1}$, and the gate of the seventh transistor N7 is coupled to the source of the sixth transistor N6 through the sixth capacitor $C_{3-2}$. The drains of the sixth transistor N6 and the seventh transistor N7 are coupled to the fifth inductor $L_{3-1}$. The source of the sixth transistor N6 is coupled to the sixth inductor $L_{3-2}$ and seventh inductor $L_{3-3}$, and the source of the seventh transistor N7 is coupled to the eighth inductor $L_{3-4}$ and ninth inductor $L_{3-5}$. In the embodiment, the low-noise amplifier 310 has a differential input and a differential output. The low-noise amplifier 310 may receive input signal from the nodes $RF_{in+}$ and $RF_{in-}$, and output the processed signal from the nodes A2 and A3.

In addition, as shown in FIG. 3, the mixer 320 is a passive I/Q mixer, and the mixer 320 may comprise a group of mixers, wherein the mixers of the group have a phase difference of 90-degrees to each other. The mixer 320 may comprise a ninth capacitor $C_{3-5}$, a tenth capacitor $C_{3-6}$, an eleventh capacitor $C_{3-7}$, a twelfth capacitor $C_{3-8}$, an eighth transistor N8, a ninth transistor N9, a tenth transistor N10, an eleventh transistor N11, a twelfth transistor N12, a thirteenth transistor N13, a fourteenth transistor N14, and a fifteenth transistor N15. The sources of the eighth transistor N8 and the ninth transistor N9 are coupled to the low-noise amplifier 310 at the node A3 through the ninth capacitor $C_{3-5}$, and the sources of the tenth transistor N10 and the eleventh transistor N11 are coupled to the low-noise amplifier 310 at the node A2 through the tenth capacitor $C_{3-6}$. The sources of the twelfth transistor N12 and the thirteenth transistor N13 are coupled to the low-noise amplifier 310 at the node A3 through the eleventh capacitor $C_{3-7}$, and the sources of the fourteenth transistor N14 and the fifteenth transistor N15 are coupled to the low-noise amplifier 310 at the node A2 through the twelfth capacitor $C_{3-8}$. The gates of the eighth transistor N8, the ninth transistor N9, the tenth transistor N10, the eleventh transistor N11, the twelfth transistor N12, the thirteenth transistor N13, the fourteenth transistor N14, and the fifteenth transistor N15 are coupled to the local oscillator 330 to receive the oscillation signals. The drains of the eighth transistor N8, the ninth transistor N9, the tenth transistor N10, the eleventh transistor N11, the twelfth transistor N12, the thirteenth transistor N13, the fourteenth transistor N14, and the fifteenth transistor N15 are coupled to the trans-impedance amplifier 340 to transmit the mixed signals to the trans-impedance amplifier 340. Then, the trans-impedance amplifier 340 may transmit the signals that it processed itself to the back-end circuits.

According to an embodiment of the disclosure, the low-noise amplifier 310 may obtain the input impedance $Z_{IN\_MIXER}$ of the mixer 320 from the nodes A2 and A3, and dynamically adjust its input impedance $Z_{IN\_LNA}$ according to the input impedance $Z_{IN}$ According to an embodiment of the disclosure, the resonant frequency of the value of the fifth inductor $L_{3-1}$ may be adjusted to the oscillation frequency.

Figure 4:
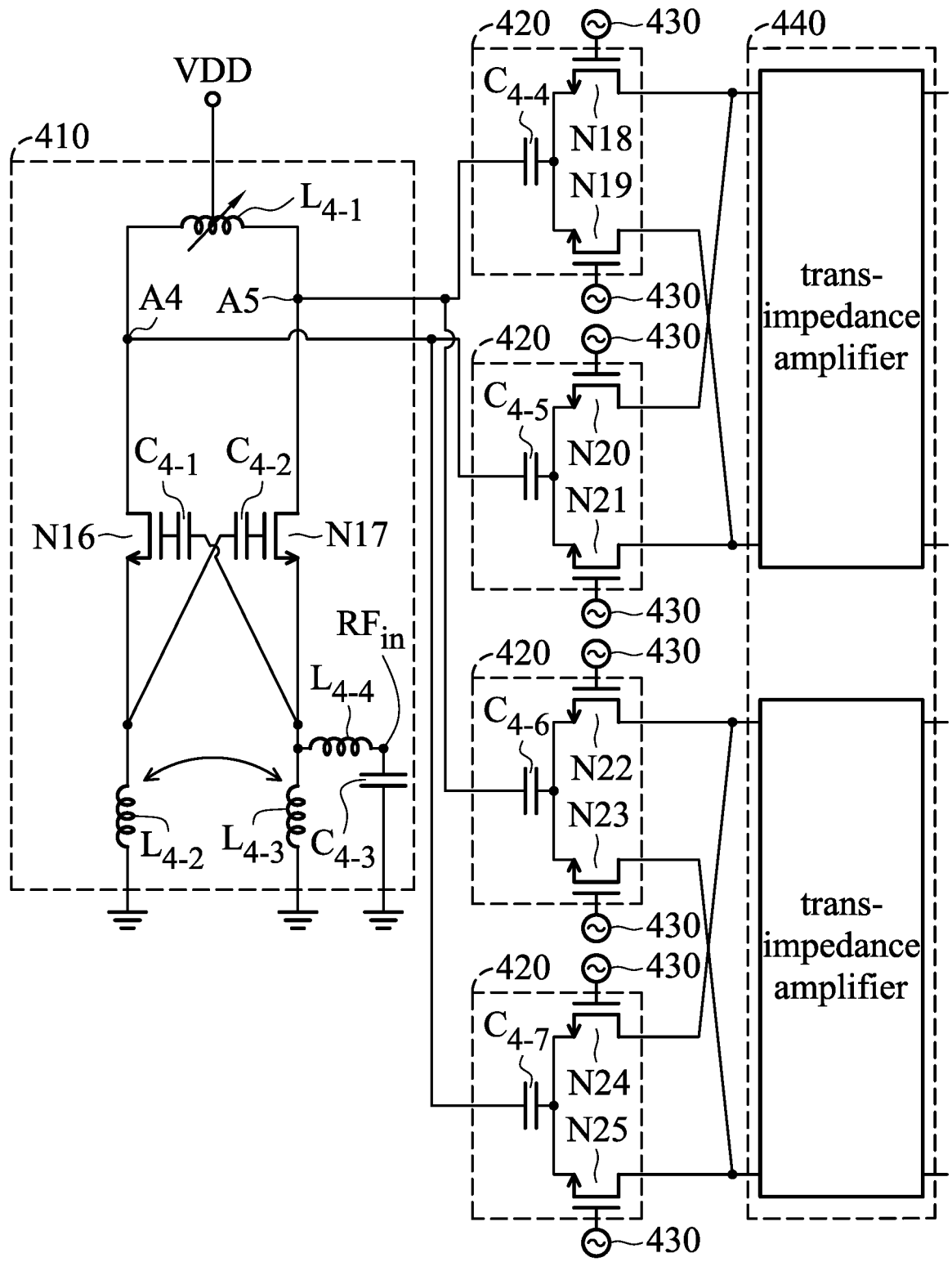
FIG. 4 is a circuit diagram of a wireless receiving device 400 according to another embodiment of the disclosure.

FIG. 4 is a circuit diagram of a wireless receiving device 400 according to another embodiment of the disclosure. As shown in FIG. 4, the low-noise amplifier 410 (i.e. a common gate amplifier) may comprise a tenth inductor $L_{4-1}$, an eleventh inductor $L_{4-2}$, a twelfth inductor $L_{4-3}$, a thirteenth inductor $L_{4-4}$, a sixteenth transistor N16, a seventeenth transistor N17, a thirteenth capacitor $C_{4-1}$, a fourteenth capacitor $C_{4-2}$, and a fifteenth capacitor $C_{4-3}$, wherein the tenth inductor $L_{4-1}$ is an adjustable inductor, and it is coupled to a power source VDD and the eleventh inductor $L_{4-2}$ and the twelfth inductor $L_{4-3}$ may form a transformer structure. The gate of the sixteenth transistor N16 is coupled to the source of the seventeenth transistor N17 through the thirteenth capacitor $C_{4-1}$, and the gate of the seventeenth transistor N17 is coupled to the source of the sixteenth transistor N16 through the fourteenth capacitor $C_{4-2}$. The drains of the sixteenth transistor N16 and the seventeenth transistor N17 are coupled to the tenth inductor $L_{4-1}$. The source of the sixteenth transistor N16 is coupled to the eleventh inductor $L_{4-2}$, and the source of the seventeenth transistor N17 is coupled to the twelfth inductor $L_{4-3}$ and thirteenth inductor $L_{4-4}$. In the embodiment, the low-noise amplifier 410 has a single-end input and a differential output. The low-noise amplifier 410 may receive input signal from the node $RF_{in}$, and output the processed signal from the nodes A4 and A5. In addition, in the embodiment, the size of the sixteenth transistor N16 is different from the size of the seventeenth transistor N17 (e.g. 3:4, but the disclosure is not limited thereto) to compensate for the imbalance of the output phase of the low-noise amplifier 410.

In addition, as shown in FIG. 3, the mixer 420 is a passive I/Q mixer, and the mixer 320 may comprise two groups of mixers, wherein the mixers of each group have a phase difference of 90-degrees to each other. The mixer 420 may comprise a sixteenth capacitor $C_{4-4}$, a seventeenth capacitor $C_{4-5}$, an eighteenth capacitor $C_{4-6}$, a nineteenth capacitor $C_{4-7}$, an eighteenth transistor N18, a nineteenth transistor N19, a twentieth transistor N20, a twenty-first transistor N21, a twenty-second transistor N22, a twenty-third transistor N23, a twenty-fourth transistor N24, and a twenty-fifth transistor N25. Because the structure of the mixer 420 is the same as the structure of mixer 320, the details of the mixer 420 will not be discussed further.

According to an embodiment of the disclosure, the low-noise amplifier 410 may obtain the input impedance $Z_{IN\_MIXER}$ of the mixer 420 from the nodes A4 and A5, and dynamically adjust its input impedance $Z_{IN\_LNA}$ according to the input impedance $Z_{IN\_MIXER}$. According to an embodiment of the disclosure, the resonant frequency of the value of the tenth inductor $L_{4-1}$ may be adjusted to the oscillation frequency.

Figure 5:
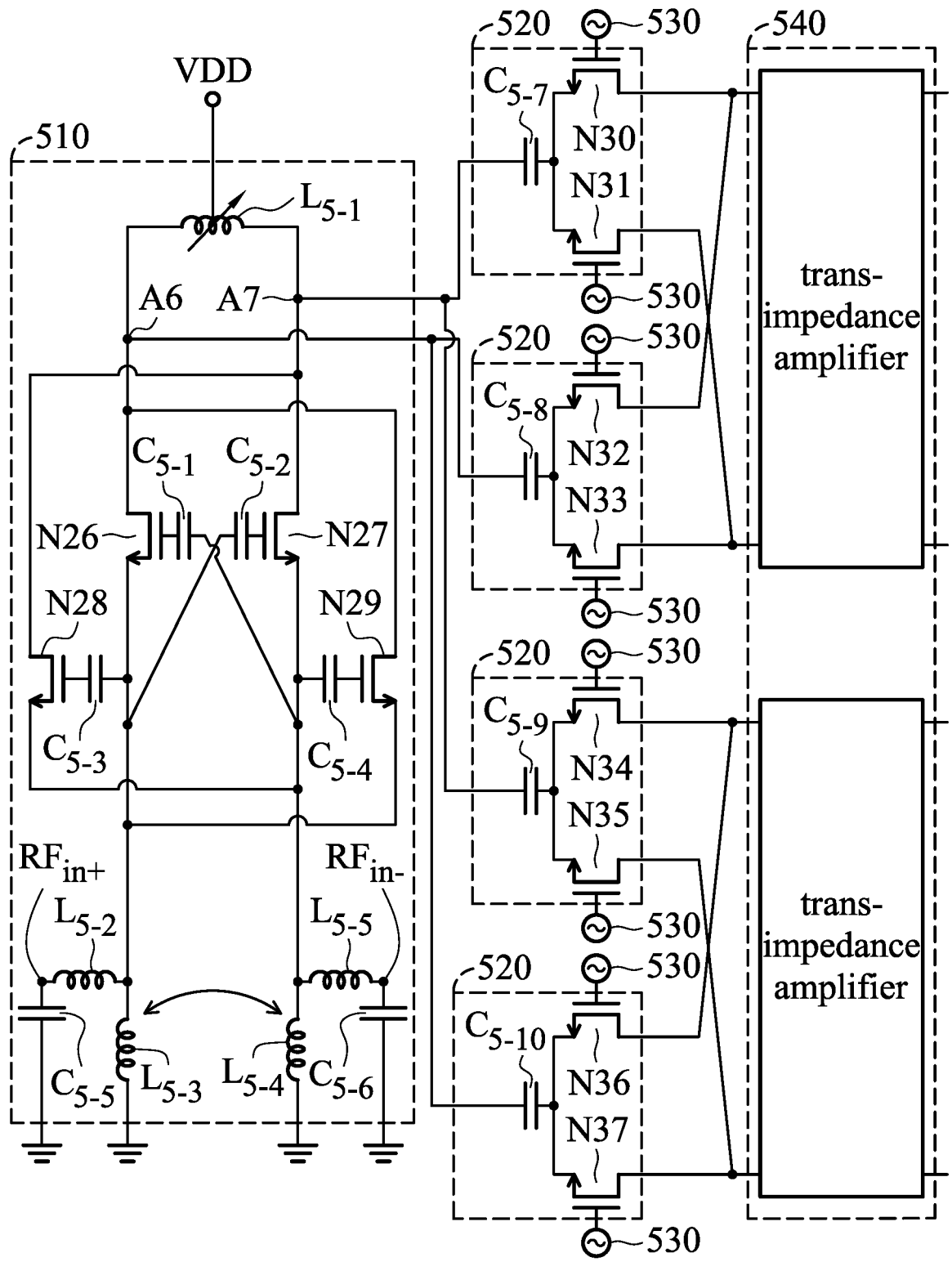
FIG. 5 is a circuit diagram of a wireless receiving device 500 according to another embodiment of the disclosure.

FIG. 5 is a circuit diagram of a wireless receiving device 500 according to another embodiment of the disclosure. As shown in FIG. 5, the low-noise amplifier 510 (i.e. a common gate amplifier) may comprise a fourteenth inductor $L_{5-1}$, a fifteenth inductor $L_{5-2}$, a sixteenth inductor $L_{5-3}$, a seventeenth inductor $L_{5-4}$, an eighteenth inductor $L_{5-5}$, a twenty-sixth transistor N26, a twenty-seventh transistor N27, a twenty-eighth transistor N28, a twenty-ninth transistor N29, a twentieth capacitor $C_{5-1}$, a twenty-first capacitor $C_{5-2}$, a twenty-second capacitor $C_{5-3}$, a twenty-third capacitor $C_{5-4}$, a twenty-fourth capacitor $C_{5-5}$, and a twenty-fifth capacitor $C_{5-6}$, wherein the fourteenth inductor $L_{5-1}$ is an adjustable inductor, and it is coupled to a power source VDD and the sixteenth inductor $L_{5-3}$ and the seventeenth inductor $L_{5-4}$ may form a transformer structure. The gate of the twenty-sixth transistor N26 is coupled to the source of the twenty-seventh transistor N27 through the twentieth capacitor $C_{5-1}$, and the gate of the twenty-seventh transistor N27 is coupled to the twenty-sixth transistor N26 through the twenty-first capacitor $C_{5-2}$. The drains of the twenty-sixth transistor N26 and the twenty-seventh transistor N27 are coupled to the fourteenth inductor $L_{5-1}$. The source of the twenty-sixth transistor N26 is coupled to the fifteenth inductor $L_{5-2}$ and sixteenth inductor $L_{5-3}$, and the source of the twenty-seventh transistor N27 is coupled to the seventeenth inductor $L_{5-4}$ and eighteenth inductor $L_{5-5}$. The gate of the twenty-eighth transistor N28 is coupled to the source of the twenty-sixth transistor N26 through the twenty-second capacitor $C_{5-3}$, and the gate of the twenty-ninth transistor N29 is coupled to the source of the twenty-seventh transistor N27 through the twenty-third capacitor $C_{5-4}$. The drain of the twenty-eighth transistor N28 is coupled to the drain of the twenty-seventh transistor N27, and the drain of the twenty-ninth transistor N29 is coupled to the drain of the twenty-sixth transistor N26. The source of the twenty-eighth transistor N28 is coupled to the gate of the twenty-sixth transistor N26, and the source of the twenty-ninth transistor N29 is coupled to the gate of the twenty-seventh transistor N27. In the embodiment, the low-noise amplifier 510 has a differential input and a differential output. The low-noise amplifier 510 may receive input signal from the nodes $RF_{in+}$ and $RF_{in-}$, and output the processed signal from the nodes A6 and A7. Furthermore, compared to FIG. 3, the low-noise amplifier 510 may further comprise the twenty-eighth transistor N28 and the twenty-ninth transistor N29. Therefore, the low-noise amplifier 510 may respectively adjust the gate voltages of the twenty-sixth transistor N26, the twenty-seventh transistor N27, the twenty-eighth transistor N28, and the twenty-ninth transistor N29 to cancel the three-stage transconductance values ($gm^3$) to achieve better third-order intermodulation linearity.

In addition, as shown in FIG. 5, the mixer 520 is a passive I/Q mixer, and the mixer 320 may comprise two groups of mixers, wherein the mixers of each group have a phase difference of 90-degrees to each other. The mixer 520 may comprise a twenty-sixth capacitor $C_{5-7}$, a twenty-seventh capacitor $C_{5-8}$, a twenty-eighth capacitor $C_{5-9}$, a twenty-ninth capacitor $C_{5-10}$, a thirtieth transistor N30, a thirty-first transistor N31, a thirty-second transistor N32, a thirty-third transistor N33, a thirty-fourth transistor N34, a thirty-fifth transistor N35, a thirty-sixth transistor N36, and a thirty-seventh transistor N37. Because the structure of mixer 520 is the same as the structure of mixer 320, the details of mixer 520 will not be discussed further.

According to an embodiment of the disclosure, the low-noise amplifier 510 may obtain the input impedance $Z_{IN\_MIXER}$ of the mixer 520 from the nodes A6 and A7, and dynamically adjust its input impedance $Z_{IN\_LNA}$ according to the input impedance $Z_{IN}$ According to an embodiment of the disclosure, the resonant frequency of the value of the fourteenth inductor $L_{5-1}$ may be adjusted to the oscillation frequency.

It should be noted that wireless receiving devices 200, 300, 400 and 500 may be applied to the wireless receiving device 100, but the disclosure is not limited thereto. Other types of common gate amplifiers and passive mixers can also be applied to the wireless receiving device 100.

Figure 6:
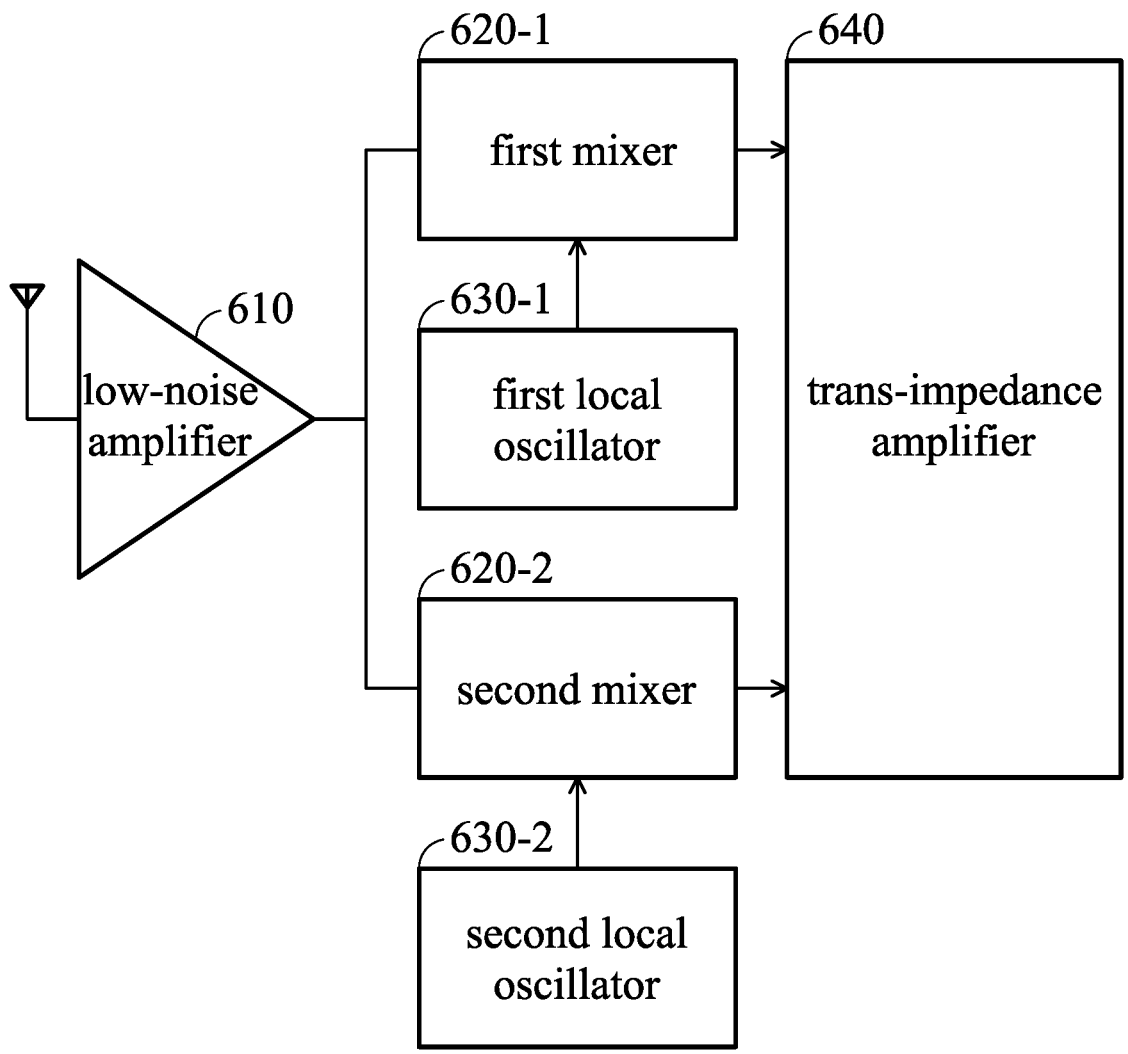
FIG. 6 is a schematic diagram of a wireless receiving device 600 according to another embodiment of the disclosure.

FIG. 6 is a schematic diagram of a wireless receiving device 600 according to another embodiment of the disclosure As shown in FIG. 6, the wireless receiving device 600 may comprise a low-noise amplifier 610, a first mixer 620-1, a second mixer 620-2, a first local oscillator 630-1, a second local oscillator 630-2 and a trans-impedance amplifier 640. It should be noted that in order to clarify the concept of the disclosure, FIG. 6 presents a simplified block diagram in which the elements relevant to the disclosure are shown, but the disclosure should not be limited to what is shown in FIG. 6. In the embodiments of the disclosure, the wireless receiving device 100 may also comprise other elements, such as analog base band (ABB), analog-to-digital convertor (ADC), and so on.

According to an embodiment of the disclosure, the transistors of the wireless receiving device 600 may be manufactured through advanced manufacturing processes for the CMOS. In the embodiment, the low-noise amplifier 610 is a common gate amplifier. Furthermore, in the embodiment, the first mixer 620-1 and the second mixer 620-2 are passive mixers. The first mixer 620-1 and the second mixer 620-2 are respectively coupled to the first local oscillator 630-1 and the second local oscillator 630-2 to receive the oscillation signals.

It should be noted that wireless receiving devices 200, 300, 400 and 500 may be applied to the wireless receiving device 600, but the disclosure is not limited thereto. Other types of common gate amplifiers and passive mixers can also be applied to the wireless receiving device 600.

Unlike the wireless receiving device 100, in the embodiment, the wireless receiving device 600 comprises two mixers (the first mixer 620-1 and the second mixer 620-2), therefore, the wireless receiving device 600 may operate in two different frequency bands at the same time. Furthermore, according to an embodiment of the disclosure, the low-noise amplifier 610 of the wireless receiving device 600 may adjust its input impedance $Z_{IN\_LNA}$ according to the first oscillation frequency $f_{LO1}$ generated by the first local oscillator 630-1 and the second oscillation frequency $f_{LO2}$ generated by the second local oscillator 630-2. For example, if the wireless receiving device 600 needs to operate in the 28 GHz frequency band and 39 GHz frequency band, the first local oscillator 630-1 and the second local oscillator 630-2 may respectively provide the oscillation signal with 28 GHz oscillation frequency and the oscillation signal with 39 GHz oscillation signal to the first mixer 620-1 and the second mixer 620-2. Furthermore, the load inductor of the low-noise amplifier 610 may be adjusted to generate 28 GHz resonance frequency and 39 GHz resonance frequency at the same time (i.e. first oscillation frequency $f_{LO1}$ and the second oscillation frequency $f_{LO2}$) to adjust the input impedance $Z_{IN\_LNA}$ of the low-noise amplifier 610.

Figure 7:
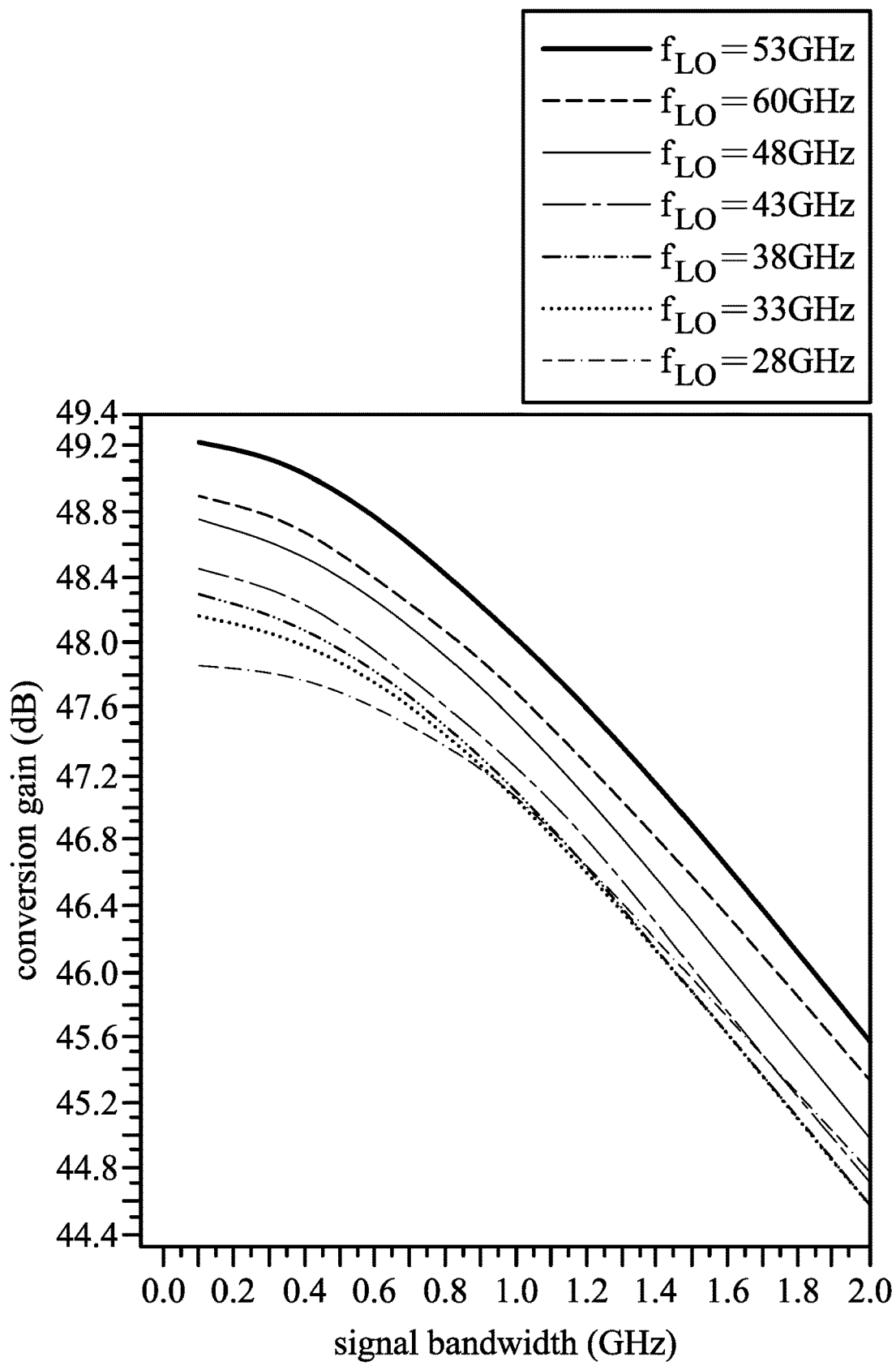
FIG. 7 is a simulation diagram of the conversion gain of the wireless receiving device 200 according to another embodiment of the disclosure.
Figure 8:
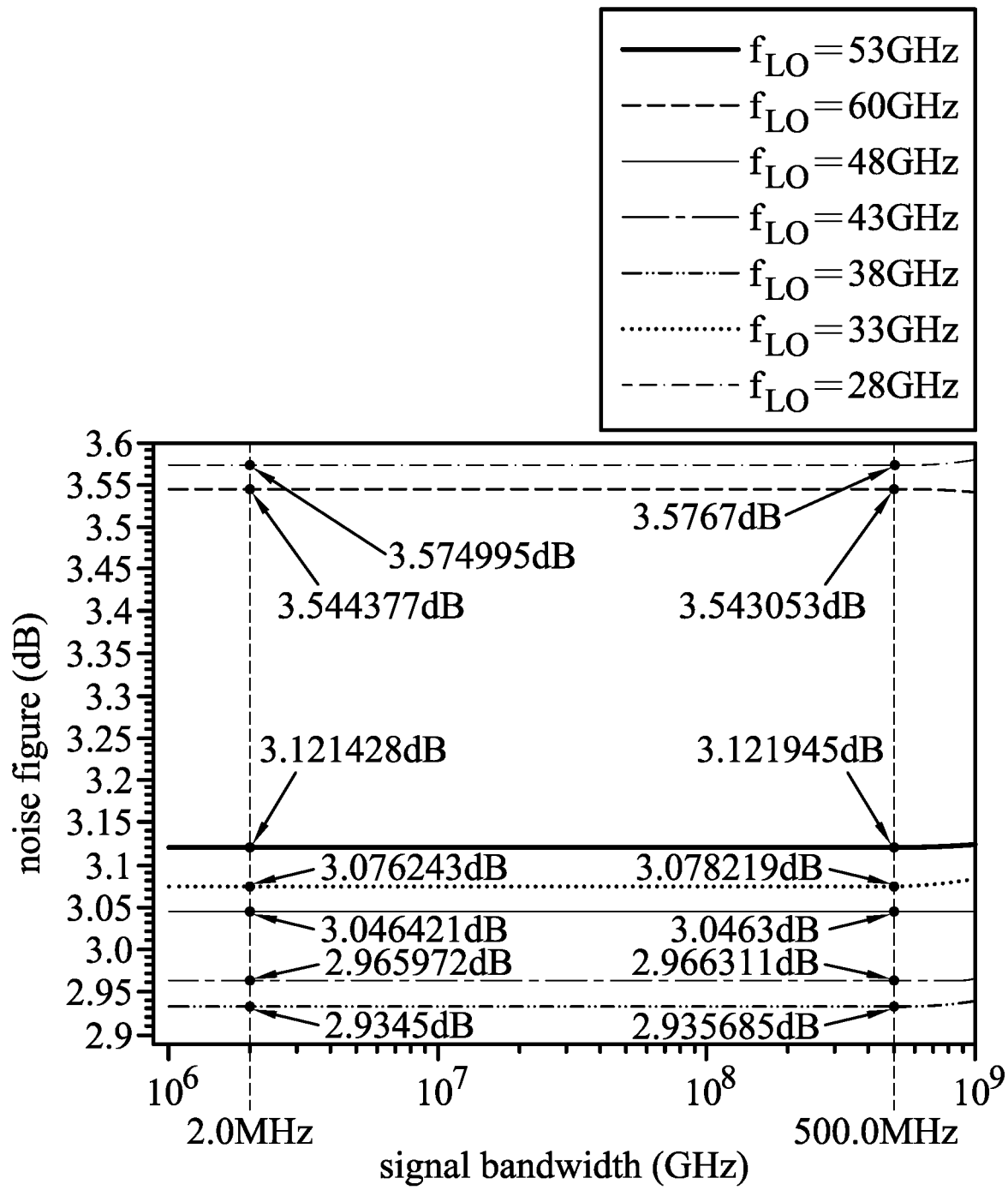
FIG. 8 is a simulation diagram of the noise figure of the wireless receiving device 200 according to another embodiment of the disclosure.

According to the wireless receiving device provided in the embodiments of the disclosure, the common gate amplifier and the passive mixer are adopted. In the structure of the wireless receiving device, the low-noise amplifier (i.e. the common gate amplifier) can automatically adjust its input impedance $Z_{IN\_LNA}$. Therefore, the wireless receiving device can automatically operate in different millimeter-wave frequency bands without configuring extra elements in the wireless receiving device. Furthermore, according to the wireless receiving device provided in the embodiments of the disclosure, the wireless receiving device can operate in higher conversion gain (e.g. the conversion gain is higher than 30 dB) and lower noise figure (e.g. the noise figure is higher than 6 dB). Taking wireless receiving device 200 for example, referring to FIG. 7, for different oscillation frequencies $f_{LO}$, the conversion gain of the wireless receiving device 200 can be maintained above 30 dB. Referring to FIG. 8, for different oscillation frequencies $f_{LO}$, the noise figure of the wireless receiving device 200 can be maintained below 6 dB.

Use of ordinal terms such as "first", "second", "third", etc., in the disclosure and claims is for description. It does not by itself connote any order relationship.

Reference throughout this specification to "one embodiment" or "an embodiment" means that a particular feature, structure, or characteristic described in connection with the embodiment is included in at least one embodiment of the disclosure, but does not denote that they are present in every embodiment. Thus, the appearance of the phrases "in one embodiment" or "in an embodiment" in various places throughout this specification are not necessarily referring to the same embodiment of the disclosure.

The above paragraphs describe many aspects of the disclosure. Obviously, the teaching of the disclosure can be accomplished by many methods, and any specific configurations or functions in the disclosed embodiments present a representative condition. Those who are skilled in this technology will understand that all of the disclosed aspects in the disclosure can be applied independently or be incorporated.

While the disclosure has been described by way of example and in terms of preferred embodiment, it should be understood that the disclosure is not limited thereto. Those who are skilled in this technology can still make various alterations and modifications without departing from the scope and spirit of this disclosure. Therefore, the scope of the present disclosure shall be defined and protected by the following claims and their equivalents.

What is claimed is:

1. A wireless receiving device, comprising:
  a first passive mixer, receiving an oscillation signal;
  a common gate amplifier, coupled to the first passive mixer, and automatically adjusting an input impedance of the common gate amplifier according to an oscillation frequency of the oscillation signal; and
  a second passive mixer, coupled to the common gate amplifier, wherein the first passive mixer and the second passive mixer respectively receive the oscillation signal with a first oscillation frequency and the oscillation signal with a second oscillation frequency.

2. The wireless receiving device of claim 1, wherein the common gate amplifier comprises a transistor, and the common gate amplifier has a single-end input and a single-end output.

3. The wireless receiving device of claim 1, wherein the common gate amplifier comprises a first transistor and a second transistor, and the common gate amplifier has a differential input and a differential output.

4. The wireless receiving device of claim 1, wherein the common gate amplifier comprises a first transistor, a second transistor, a third transistor, and a fourth transistor, and the common gate amplifier has a differential input and a differential output.

5. The wireless receiving device of claim 1, wherein the common gate amplifier adjusts the input impedance of the common gate amplifier according to the first oscillation frequency and the second oscillation frequency.

6. The wireless receiving device of claim 1, wherein transistors of the wireless receiving device are manufactured through advanced manufacturing processes.

\* \* \* \* \*